United States Patent
Takamine

(10) Patent No.: US 10,651,822 B2
(45) Date of Patent: May 12, 2020

(54) MULTIPLEXER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 65 days.

(21) Appl. No.: 16/019,680

(22) Filed: Jun. 27, 2018

(65) Prior Publication Data
US 2019/0013793 A1    Jan. 10, 2019

(30) Foreign Application Priority Data
Jul. 5, 2017    (JP) ................. 2017-132088

(51) Int. Cl.
*H03H 9/72* (2006.01)
*H03H 9/64* (2006.01)
*H04B 1/00* (2006.01)
*H03H 9/05* (2006.01)

(52) U.S. Cl.
CPC .......... *H03H 9/725* (2013.01); *H03H 9/0576* (2013.01); *H03H 9/6436* (2013.01); *H03H 9/6476* (2013.01); *H03H 9/6483* (2013.01); *H04B 1/00* (2013.01); *H04B 1/0057* (2013.01)

(58) Field of Classification Search
CPC .... H03H 9/725; H03H 9/6476; H03H 9/0576; H03H 9/6436; H03H 9/6483; H03H 9/6433; H03H 9/02574; H03H 7/38; H04B 1/0057; H04B 1/00
USPC ................. 333/133, 187, 188, 193–196
See application file for complete search history.

(56) References Cited

U.S. PATENT DOCUMENTS

| 2011/0193650 | A1* | 8/2011 | Takenoshita | H03H 9/0576 333/4 |
|---|---|---|---|---|
| 2017/0194939 | A1* | 7/2017 | Mukai | H03H 9/64 |
| 2018/0109243 | A1 | 4/2018 | Takamine | |
| 2018/0302060 | A1* | 10/2018 | Kauschke | H03H 9/6483 |

FOREIGN PATENT DOCUMENTS

WO    2016/208670 A1    12/2016

* cited by examiner

*Primary Examiner* — Robert J Pascal
*Assistant Examiner* — Jorge L Salazar, Jr.
(74) *Attorney, Agent, or Firm* — Keating & Bennett, LLP

(57) ABSTRACT

A multiplexer includes a common connection terminal on a first surface of a substrate and to be connected to an antenna element, and transmission-side and reception-side elastic wave filters of Band25 and Band66 mounted on a second surface of the substrate opposite the first surface, that are connected to the common connection terminal, and that have pass bands different from each other. The transmission-side elastic wave filter of Band66 is located nearest on the substrate to the common connection terminal among the elastic wave filters.

18 Claims, 11 Drawing Sheets

MULTIPLEXER

CROSS REFERENCE TO RELATED APPLICATIONS

This application claims the benefit of priority to Japanese Patent Application No. 2017-132088 filed on Jul. 5, 2017. The entire contents of this application are hereby incorporated herein by reference.

BACKGROUND OF THE INVENTION

1. Field of the Invention

The present invention relates to a multiplexer including an elastic wave filter.

2. Description of the Related Art

In recent years, there has been a need for a cellular phone that supports multiple frequency bands and multiple wireless systems, that is, a multi-band and multi-mode cellular phone is desired. To fulfill the need, a multiplexer that separates high-frequency signals having multiple wireless carrier frequencies is disposed next to an antenna. Band pass filters included in the multiplexer are elastic wave filters each of which has a low loss in a pass band and steepness of a bandpass characteristic in a band near the pass band.

International Publication No. 2016/208670 discloses a surface acoustic wave device (SAW duplexer) in which surface acoustic wave filters are connected to a common antenna terminal.

In a surface acoustic wave filter including a piezoelectric layer, energy of a high-frequency power is confined within the piezoelectric layer, and in some cases, a higher-order mode occurs at a frequency higher than a filter pass band. The occurrence of the higher-order mode increases a return loss. Accordingly, when the frequency at which the higher-order mode occurs is in the pass band of another surface acoustic wave filter connected to the antenna terminal, a ripple occurs in the pass band of the other surface acoustic wave filter, and an insertion loss is increased. Consequently, the bandpass characteristic of the entire multiplexer is degraded.

SUMMARY OF THE INVENTION

Accordingly, preferred embodiments of the present invention provide multiplexers that are each able to prevent the bandpass characteristic from being degraded.

According to a preferred embodiment of the present invention, a multiplexer that transmits and receives high-frequency signals via an antenna element includes a common connection terminal that is disposed on a first surface of a substrate and that is to be connected to the antenna element, and at least three elastic wave filters that are mounted on a second surface of the substrate opposite the first surface, that are connected to the common connection terminal, and that have pass bands different from each other. A first elastic wave filter of the at least three elastic wave filters, which generates a spurious wave at a frequency that is included in a pass band of a second elastic wave filter that is at least one of the elastic wave filters that differs from the first elastic wave filter among the at least three elastic wave filters, is located nearest on or in the substrate to the common connection terminal among the at least three elastic wave filters.

With this structure, a decrease in an inductance component of the first elastic wave filter enables a decrease in a spurious wave generated from the first elastic wave filter at a frequency corresponding to a pass band of a second elastic wave filter. Consequently, the bandpass characteristic of the second elastic wave filter whose pass band includes the frequency at which the spurious wave is generated from the first elastic wave filter is prevented from being degraded. Accordingly, the bandpass characteristic of the multiplexer is prevented from being degraded.

The first elastic wave filter may generate a spurious wave at a frequency that is included in a pass band of a second elastic wave filter that is at least one of the elastic wave filters that differs from the first elastic wave filter among the at least three elastic wave filters.

With this structure, the spurious wave generated from the first elastic wave filter is decreased, and the bandpass characteristic of the second elastic wave filter is prevented from being degraded. Accordingly, the bandpass characteristic of the multiplexer is prevented from being degraded.

The second elastic wave filter may be located nearer on the substrate to the common connection terminal than the other elastic wave filter or filters other than the first elastic wave filter and the second elastic wave filter among the at least three elastic wave filters.

With this structure, the second elastic wave filter that is affected by the spurious wave generated from the first elastic wave filter is located near the common connection terminal, and the effect of the spurious wave on the second elastic wave filter is further decreased. Accordingly, the bandpass characteristic of the second elastic wave filter is further prevented from being degraded, and the bandpass characteristic of the multiplexer is further prevented from being degraded.

The substrate may include multiple layers. A wiring line connecting the first elastic wave filter and the common connection terminal to each other may be provided in/on only one of the layers.

With this structure, the wiring line is prevented from extending over multiple layers. Accordingly, the length of the wiring line is decreased, and the inductance component of the first elastic wave filter is further decreased. Accordingly, the bandpass characteristic of the second elastic wave filter is further prevented from being degraded, and the bandpass characteristic of the multiplexer is further prevented from being degraded.

The first elastic wave filter may include an input terminal, an output terminal, and at least one of a parallel arm resonator unit and a series arm resonator unit, the series arm resonator unit may be disposed on a path connecting the input terminal and the output terminal to each other, and the parallel arm resonator unit may be connected between the path and a reference (ground) terminal. At least one of the series arm resonator unit nearest to the common connection terminal and the parallel arm resonator unit nearest to the common connection terminal may include elastic wave resonators that are connected in series, and a first capacitance element that is connected between at least one of paths connecting the elastic wave resonators to each other and a reference terminal.

With this structure, the inductance component of the first elastic wave filter is decreased and the capacitance component thereof is increased. Accordingly, the spurious wave generated from the first elastic wave filter at a frequency in the pass band of the second elastic wave filter is further decreased. Consequently, the bandpass characteristic of the second elastic wave filter is further prevented from being degraded, and the bandpass characteristic of the multiplexer is prevented from being degraded.

The first elastic wave filter may include an input terminal, an output terminal, and at least one of a parallel arm resonator unit and a series arm resonator unit, the series arm resonator unit may be disposed on a path connecting the input terminal and the output terminal to each other, and the parallel arm resonator unit may be connected between the path and a reference terminal. At least one of the series arm resonator unit nearest to the common connection terminal and the parallel arm resonator unit nearest to the common connection terminal may include at least one elastic wave resonator, and a second capacitance element that is connected to the at least one elastic wave resonator in parallel so as to bridge both end portions of the at least one elastic wave resonator.

With this simple structure, the inductance component of the first elastic wave filter is decreased, the capacitance component thereof is increased, and this further decreases the spurious wave generated from the first elastic wave filter at a frequency in the pass band of the second elastic wave filter. Consequently, the bandpass characteristic of the second elastic wave filter is prevented from being degraded, and the bandpass characteristic of the multiplexer is prevented from being degraded.

A piezoelectric substrate included in the first elastic wave filter may include a piezoelectric film including a surface on which an interdigital transducer electrode is provided, a high acoustic velocity support substrate through which a bulk wave is propagated at an acoustic velocity higher than an acoustic velocity at which an elastic wave is propagated through the piezoelectric film, and a low acoustic velocity film that is disposed between the high acoustic velocity support substrate and the piezoelectric film and through which a bulk wave is propagated at an acoustic velocity lower than an acoustic velocity at which a bulk wave is propagated through the piezoelectric film.

A piezoelectric substrate included in the first elastic wave filter may be made of a $LiNbO_3$ piezoelectric single crystal substrate including a surface on which an interdigital transducer electrode is provided.

With this structure, the spurious wave is decreased, and the bandpass characteristic of the multiplexer is prevented from being degraded, even when the elastic wave filters likely to cause a ripple at a frequency of the higher-order mode of the resonant frequency of a resonator are provided.

According to preferred embodiments of the present invention, multiplexers are provided that prevent the bandpass characteristic from being degraded.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
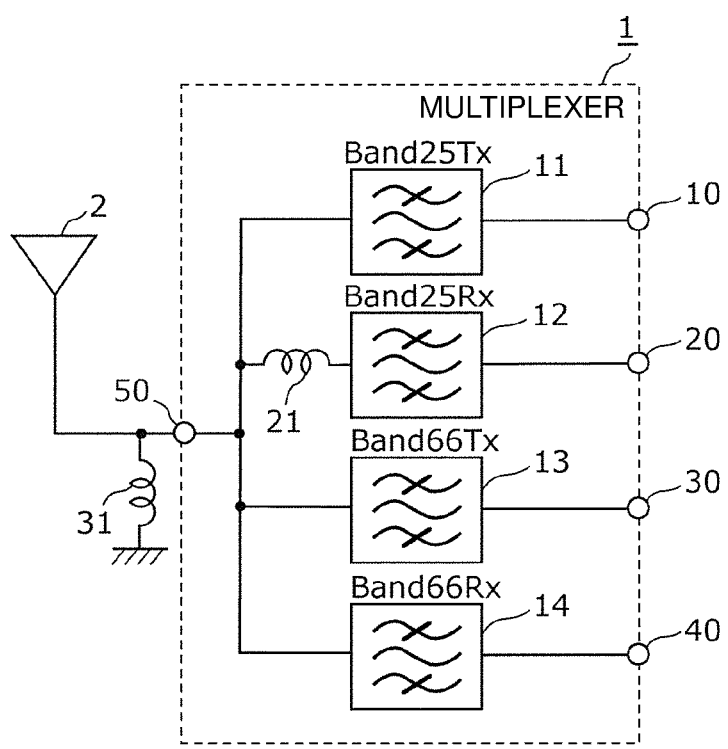
FIG. 1 is a circuit diagram of a multiplexer according to a preferred embodiment of the present invention.

Preferred embodiments of the present invention will hereinafter be described in detail with reference to the drawings. The preferred embodiments described below are comprehensive or specific examples. In the following description according to the preferred embodiments, numerical values, shapes, materials, components, and the arrangement and connection configurations of the components are described by way of example and do not limit the present invention. Among the components according to the preferred embodiments described below, components that are not recited in the independent claim are described as optional components. In the drawings, the dimensions of the components and ratios of the dimensions are not necessarily illustrated strictly.

According to a preferred embodiment of the present invention, a quadplexer is described by way of example, and the quadplexer is preferably used in, for example, Band25 (a transmission pass band of about 1850 MHz to about 1915 MHz, and a reception pass band of about 1930 MHz to about 1995 MHz) and in Band66 (a transmission pass band of about 1710 MHz to about 1780 MHz, and a reception pass band of about 2010 MHz to about 2200 MHz) of Frequency Division Duplex-Long Term Evolution (FDD-LTE) standard.

A multiplexer 1 according to the present preferred embodiment is preferably a quadplexer in which a Band25 duplexer and a Band66 duplexer are connected to each other at a common connection terminal 50.

FIG. 1 is a circuit diagram of the multiplexer 1 according to the present preferred embodiment. As illustrated in FIG. 1, the multiplexer 1 includes transmission-side filters 11 and 13, reception-side filters 12 and 14, an inductance element 21, a common connection terminal 50, transmission input terminals and 30, and reception output terminals 20 and 40. The transmission-side filters 11 and 13 and the reception-side filters 12 and 14 are preferably surface acoustic wave filters, for example. The multiplexer 1 is connected to an antenna element 2 at the common connection terminal 50. An inductance element 31 is connected between a path connecting the common connection terminal 50 and the antenna element 2 and the ground that corresponds to a reference terminal. The inductance element 31 may be connected in series between the common connection terminal 50 and the antenna element 2. The multiplexer 1 may not include the inductance element 31. The inductance element 31 may be included in the multiplexer 1 or may be an external component of the multiplexer 1.

The transmission-side filter 11 is preferably an unbalanced-input-unbalanced-output-type band pass filter that receives a transmission wave provided by a transmission circuit (such as a RFIC) via the transmission input terminal 10, filters the transmission wave in the transmission pass band (about 1850 MHz to about 1915 MHz) of Band25, and outputs the filtered wave to the common connection terminal 50.

The reception-side filter 12 is preferably an unbalanced-input-unbalanced-output band pass filter that receives a reception wave from the common connection terminal 50, filters the reception wave in the reception pass band (about 1930 MHz to about 1995 MHz) of Band25, and outputs the filtered wave to the reception output terminal 20. The inductance element 21 is connected in series between the reception-side filter 12 and the common connection terminal 50. As a result of the inductance element 21 being connected to a side of the reception-side filter 12 nearer to the common connection terminal 50, the impedances of the transmission-side filters 11 and 13 and the reception-side filter 14 are inductive. The pass bands of the transmission-side filters 11 and 13 and the reception-side filter 14 are outside the pass band of the reception-side filter 12. The multiplexer 1 may not include the inductance element 21 between the reception-side filter 12 and the common connection terminal 50.

The transmission-side filter 13 is preferably an unbalanced-input-unbalanced-output band pass filter that receives a transmission wave provided by a transmission circuit (such as RFIC) via the transmission input terminal 30, filters the transmission wave in the transmission pass band (about 1710 MHz to about 1780 MHz) of Band66, and outputs the filtered wave to the common connection terminal 50. In the multiplexer 1 according to the present preferred embodiment, the transmission-side filter 13 is a first elastic wave filter.

The transmission-side filter 13 generates a spurious wave at a frequency that is in the pass band of the reception-side filter 14. The multiplexer 1 according to the present preferred embodiment is able to prevent the reception-side filter 14 from being affected by the spurious wave generated by the transmission-side filter 13 as described later.

The reception-side filter 14 is preferably an unbalanced-input-unbalanced-output band pass filter that receives a reception wave from the common connection terminal 50, filters the reception wave in the reception pass band (about 2010 MHz to about 2200 MHz) of Band66, and outputs the filtered wave to the reception output terminal 40. In the multiplexer 1 according to the present preferred embodiment, the reception-side filter 14 is a second elastic wave filter.

The transmission-side filters 11 and 13 and the reception-side filters 12 and 14 each include at least one series arm resonator connected in series to a series arm that corresponds to a path connecting the corresponding input and output terminals to each other as described later, and at least one parallel arm resonator connected to a parallel arm that corresponds to a path connecting the series arm and the reference terminal (ground). Each series arm resonator and each parallel arm resonator are preferably surface acoustic wave resonators, for example.

The transmission-side filters 11 and 13 and the reception-side filter 14 are directly connected to the common connection terminal 50, and no element is interposed therebetween. The reception-side filter 12 is connected to the common connection terminal 50 with the inductance element 21 interposed therebetween.

The inductance element 21 is not limited to being connected between the reception-side filter 12 and the common connection terminal 50 and may be connected in series between the reception-side filter 14 and the common connection terminal 50. The multiplexer 1 may not include the inductance element 21.

The structure of each surface acoustic wave resonator included in the transmission-side filters 11 and 13 and the reception-side filters 12 and 14 will now be described.

Figure 2A:
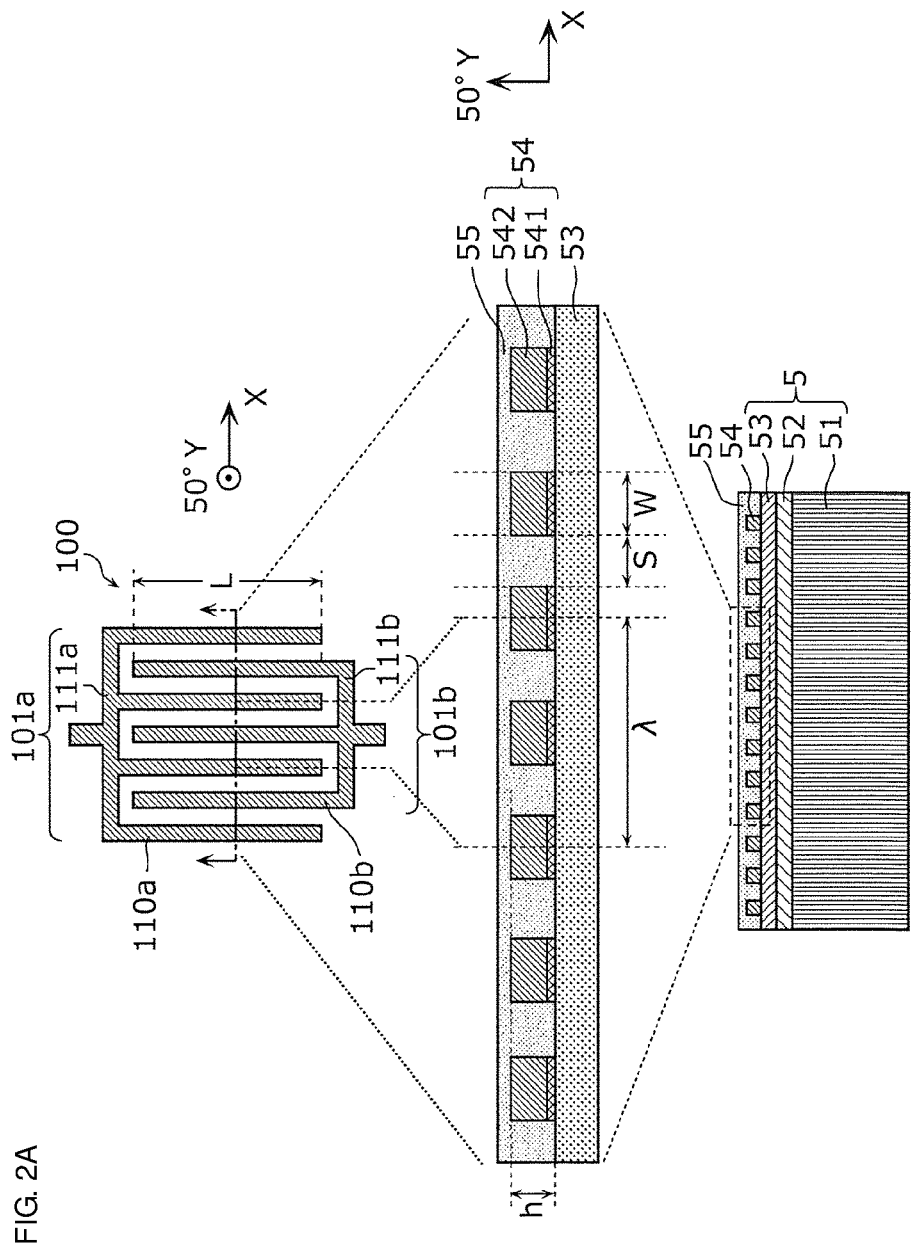
FIG. 2A illustrates a schematic plan view and schematic sectional views of an example of a resonator according to a preferred embodiment of the present invention.

FIG. 2A at (a) illustrates a schematic plan view of an example of a surface acoustic wave resonator according to the present preferred embodiment, and FIG. 2A at (b) and (c) illustrates sectional views thereof along a one-dot chain line illustrated at (a). In the plan view and the sectional views in FIG. 2A, the structure of a resonator 100 is schematically illustrated. The resonator 100 defines a series arm resonator 101 of the transmission-side filter 11 among the series arm resonators and the parallel arm resonators included in the transmission-side filters 11 and 13 and the reception-side filters 12 and 14. The resonator 100 is illustrated in FIG. 2A to describe a typical structure of each of the resonators, and the number and the length of electrode fingers of the electrodes are not limited thereto.

The resonator 100 includes a piezoelectric substrate 5 and interdigital transducer electrodes 101a and 101b that are comb-shaped or substantially comb-shaped.

As illustrated in FIG. 2A at (a), a pair of the interdigital transducer electrodes 101a and 101b that face each other are provided on the piezoelectric substrate 5. The interdigital transducer electrode 101a includes electrode fingers 110a that are parallel or substantially parallel with each other, and a busbar electrode 111a connecting the electrode fingers 110a to each other. The interdigital transducer electrode 101b includes electrode fingers 110b that are parallel or substantially parallel with each other, and a busbar electrode 111b connecting the electrode fingers 110b to each other. The electrode fingers 110a and 110b extend in a direction perpendicular or substantially perpendicular to the X-axis direction.

As illustrated in FIG. 2A at (b), an interdigital transducer electrode 54 including the electrode fingers 110a and 110b and the busbar electrodes 111a and 111b has a multilayer structure including a close-contact layer 541 and a main electrode layer 542.

The close-contact layer 541 improves adhesion between the piezoelectric substrate 5 and the main electrode layer 542, and a preferred example of the material thereof is Ti. The film thickness of the close-contact layer 541 is preferably, for example, about 12 nm.

A preferred example of the material of the main electrode layer 542 is Al including about 1% of Cu. The film thickness of the main electrode layer 542 is preferably, for example, about 162 nm.

A protective layer 55 covers the interdigital transducer electrodes 101a and 101b. The protective layer 55 protects the main electrode layer 542 from external environment, adjusts frequency and temperature characteristics, and increases humidity resistance, and is preferably, for example, a film whose main component is silicon dioxide. The thickness of the protective layer 55 is preferably, for example, about 25 nm.

The materials of the close-contact layer 541, the main electrode layer 542, and the protective layer 55 are not limited to the above-described materials. The interdigital transducer electrode 54 may not have the above multilayer structure. The interdigital transducer electrode 54 may be made of, for example, a metal such as Ti, Al, Cu, Pt, Au, Ag, or Pd, or an alloy thereof. The interdigital transducer electrode 54 may be made of multilayer bodies of the above-described metal or alloy. The protective layer 55 may not be provided.

The multilayer structure of the piezoelectric substrate 5 will now be described.

As illustrated in FIG. 2A at (c), the piezoelectric substrate 5 includes a high acoustic velocity support substrate 51, a low acoustic velocity film 52, and a piezoelectric film 53. The high acoustic velocity support substrate 51, the low acoustic velocity film 52, and the piezoelectric film 53 are stacked in this order.

The piezoelectric film 53 is preferably made of, for example, a 50° Y cut X SAW propagation $LiTaO_3$ piezoelectric single crystal or piezoelectric ceramics (lithium tantalate single crystal that is cut along a plane whose normal coincides with an axis rotated approximately 50° about the X-axis from the Y-axis or ceramics, and a surface acoustic wave is propagated in the X-axis direction through the single crystal or ceramics). The thickness of the piezoelectric film 53 is preferably, for example, about 600 nm. The piezoelectric film 53 made of a 42° to 45° Y cut X SAW propagation $LiTaO_3$ piezoelectric single crystal or piezoelectric ceramics is preferably used, for example, for the transmission-side filter 13 and the reception-side filter 14.

The high acoustic velocity support substrate 51 supports the low acoustic velocity film 52, the piezoelectric film 53, and the interdigital transducer electrode 54. A bulk wave is propagated through the high acoustic velocity support substrate 51 at an acoustic velocity higher than an acoustic velocity at which an elastic wave such as a surface acoustic wave or a boundary wave is propagated through the piezoelectric film 53. The high acoustic velocity support substrate 51 confines a surface acoustic wave in a portion at which the piezoelectric film 53 and the low acoustic velocity film 52 are stacked and prevents the surface acoustic wave from leaking downward from the high acoustic velocity support substrate 51. An example of the high acoustic velocity support substrate 51 is a silicon substrate, and the thickness thereof is preferably, for example, about 200 μm.

A bulk wave is propagated through the low acoustic velocity film 52 at an acoustic velocity lower than an acoustic velocity at which a bulk wave is propagated through the piezoelectric film 53, and the low acoustic velocity film 52 is disposed between the piezoelectric film 53 and the high acoustic velocity support substrate 51. Because of this structure and a property of an elastic wave whose energy substantially concentrates on a low acoustic velocity medium, the energy of a surface acoustic wave is prevented from leaking to the outside of the interdigital transducer electrode. A preferred example of a main component of the low acoustic velocity film 52 is silicon dioxide, and the thickness thereof is preferably, for example, about 670 nm.

With the above-described multilayer structure of the piezoelectric substrate 5, a Q factor at a resonant frequency and an anti-resonant frequency is able to be greatly increased more than with a structure of the related art including a piezoelectric substrate in a single layer. That is, a surface acoustic wave resonator having a high Q factor is able to be obtained, and the use of the surface acoustic wave resonator enables a filter having a low insertion loss to be obtained.

Circuit elements, such as an inductance element and a capacitance element, are added for impedance matching between the surface acoustic wave filters, in such a case in which the inductance element 21 for impedance matching is connected in series to the side of the reception-side filter 12 nearer to the common connection terminal 50. Consequently, it is assumed that the Q factor of the resonator 100 equivalently decreases. However, even in this case, the above-described multilayer structure of the piezoelectric substrate 5 enables the Q factor of the resonator 100 to be maintained at a high value.

The high acoustic velocity support substrate 51 may have a multilayer structure including a support substrate and a high acoustic velocity film through which a bulk wave is propagated at an acoustic velocity higher than an acoustic velocity at which an elastic wave such as a surface acoustic wave or a boundary wave is propagated through the piezoelectric film 53. In this case, examples of the material of the support substrate may preferably include sapphire, piezoelectric materials, such as lithium tantalate, lithium niobate, and crystal, ceramics such as alumina, magnesia, silicon nitride, aluminum nitride, silicon carbide, zirconia, cordierite, mullite, steatite, and forsterite, a dielectric such as glass, a semiconductor such as silicon and gallium nitride, and a resin. Examples of the material of the high acoustic velocity film may preferably include aluminum nitride, aluminum oxide, silicon carbide, silicon nitride, silicon oxynitride, DLC, diamond, a medium whose main component is one of these materials, and a medium whose main component is a mixture of these materials.

Figure 2B:
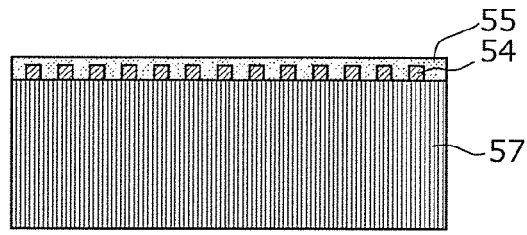
FIG. 2B illustrates a schematic sectional view of another example of a resonator according to a preferred embodiment of the present invention.

FIG. 2B illustrates a schematic sectional view of another example of a resonator 100 according to a preferred embodiment of the present. The resonator 100 illustrated in FIG. 2A by way of example includes the interdigital transducer electrode 54 provided on the piezoelectric substrate 5 including the piezoelectric film 53. As illustrated in FIG. 2B, the substrate on which the interdigital transducer electrode 54 is provided may be a piezoelectric substrate 57 made of a single piezoelectric layer. The piezoelectric substrate 57 is preferably made of, for example, a LiNbO$_3$ piezoelectric single crystal.

The multilayer structure, the material, the cut-angles, and the thickness of each of the piezoelectric film 53 and the piezoelectric substrate 57 may be appropriately changed in accordance with the required bandpass characteristic of an elastic wave filter device. Even when the resonator 100 is made of a LiTaO$_3$ piezoelectric substrate having cut-angles different from the above-described cut-angles, the same or substantially the same advantageous effects as in the case of using the resonator 100 including the piezoelectric film 53 able to be achieved.

In FIG. 2A at (a) and (b), X is the repetition pitch of the electrode fingers 110a and 110b of the interdigital transducer electrodes 101a and 101b, L is the intersecting width of the interdigital transducer electrodes 101a and 101b, W is the width of each of the electrode fingers 110a and 110b, S is a distance between each electrode finger 110a and the corresponding electrode finger 110b, and h is the height of each of the interdigital transducer electrodes 101a and 101b. Parameters that define the shape and size of the resonator 100 are referred to as resonator parameters, examples of which include the repetition pitch X, the intersecting width L, the width W of each electrode finger, the distance S between the electrode fingers, and the height h of each interdigital transducer electrode.

The circuit structure of each elastic wave filter will now be described with reference to FIG. 3A to FIG. 3D.

Figure 3A:
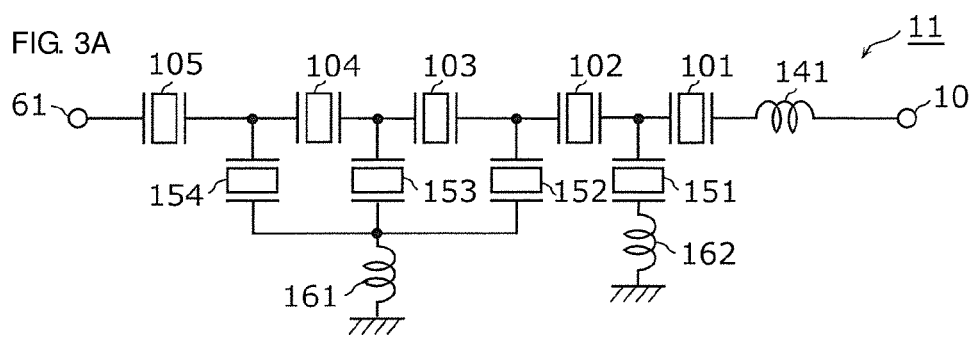
FIG. 3A is a circuit diagram of a transmission-side filter of Band25 included in a multiplexer according to a preferred embodiment of the present invention.

FIG. 3A is a circuit diagram of the transmission-side filter 11 of Band25 included in the multiplexer 1 according to the present preferred embodiment. As illustrated in FIG. 3A, the transmission-side filter 11 includes the series arm resonators 101 to 105, parallel arm resonators 151 to 154, and inductance elements 141, 161, and 162 that provide matching.

The series arm resonators 101 to 105 are connected in series with each other to a series arm corresponding to a path connecting the transmission input terminal 10 and a transmission output terminal 61. The parallel arm resonators 151 to 154 are connected in parallel with each other to respective parallel arms corresponding to paths connecting the reference terminal (ground) and nodes between the transmission input terminal 10, the transmission output terminal 61, and the series arm resonators 101 to 105 to each other. With this structure of connections between the series arm resonators 101 to 105 and the parallel arm resonators 151 to 154, the transmission-side filter 11 defines a ladder band pass filter.

The inductance element 141 is connected in series between the transmission input terminal 10 and the series arm resonator 101. The inductance element 141 may be connected between a path connecting the transmission input terminal 10 and the series arm resonator 101 to each other and the reference terminal. The inductance element 141 enables the isolation of the transmission-side filter 11 to be increased by using coupling between the inductance element 141 and the other inductance elements 161 and 162.

The inductance element 161 is connected between the node of the parallel arm resonators 152, 153, and 154 and the reference terminal. The inductance element 162 is connected between the parallel arm resonator 151 and the reference terminal.

The transmission output terminal 61 is connected to the common connection terminal 50 (see FIG. 1). The transmission output terminal 61 is connected to the series arm resonator 105 but is not directly connected to the parallel arm resonators 151 to 154.

Figure 3B:
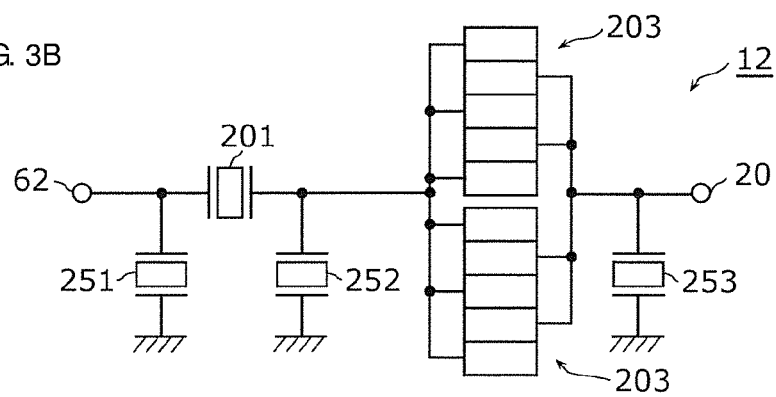
FIG. 3B is a circuit diagram of a reception-side filter of Band25 included in a multiplexer according to a preferred embodiment of the present invention.
Figure 3C:
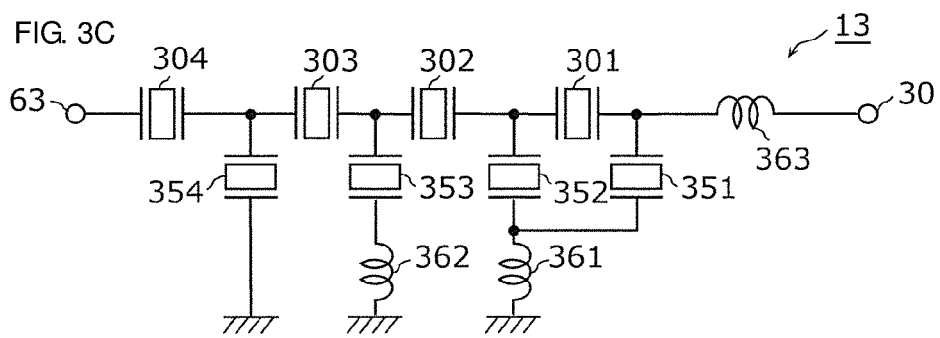
FIG. 3C is a circuit diagram of a transmission-side filter of Band66 included in a multiplexer according to a preferred embodiment of the present invention.

FIG. 3C is a circuit diagram of the transmission-side filter 13 of Band66 included in the multiplexer 1 according to the present preferred embodiment. As illustrated in FIG. 3C, the transmission-side filter 13 includes series arm resonators 301 to 304, parallel arm resonators 351 to 354, and inductance elements 361 to 363 that provide matching.

The series arm resonators 301 to 304 are connected in series with each other to a series arm corresponding to a path connecting the transmission input terminal 30 and a transmission output terminal 63 to each other. The parallel arm resonators 351 to 354 are connected in parallel with each other to respective parallel arms corresponding to paths connecting the reference terminal (ground) and nodes between the transmission input terminal 30, the transmission output terminal 63, and the series arm resonators 301 to 304 to each other. With this structure of connections between the series arm resonators 301 to 304 and the parallel arm resonators 351 to 354, the transmission-side filter 13 defines a ladder band pass filter. The inductance element 361 is connected between the nodes of the parallel arm resonators 351 and 352 and the reference terminal. The inductance element 362 is connected between the parallel arm resonator 353 and the reference terminal. The inductance element 363 is connected between the transmission input terminal 30 and the series arm resonator 301. The inductance element 363 may be connected in parallel with the transmission input terminal 30, that is, may be connected between a path connecting the transmission input terminal 30 and the series arm resonator 301 to each other and the reference terminal.

The transmission output terminal 63 is connected to the common connection terminal 50 (see FIG. 1). The transmission output terminal 63 is connected to the series arm resonator 304 but is not directly connected to the parallel arm resonators 351 to 354.

FIG. 3B is a circuit diagram of the reception-side filter 12 of Band25 included in the multiplexer 1 according to the present preferred embodiment. As illustrated in FIG. 3B, the reception-side filter 12 includes, for example, a longitudinally-coupled surface acoustic wave filter. More specifically, the reception-side filter 12 includes a longitudinally-coupled filter 203, a series arm resonator 201, and parallel arm resonators 251 to 253.

Figure 4:
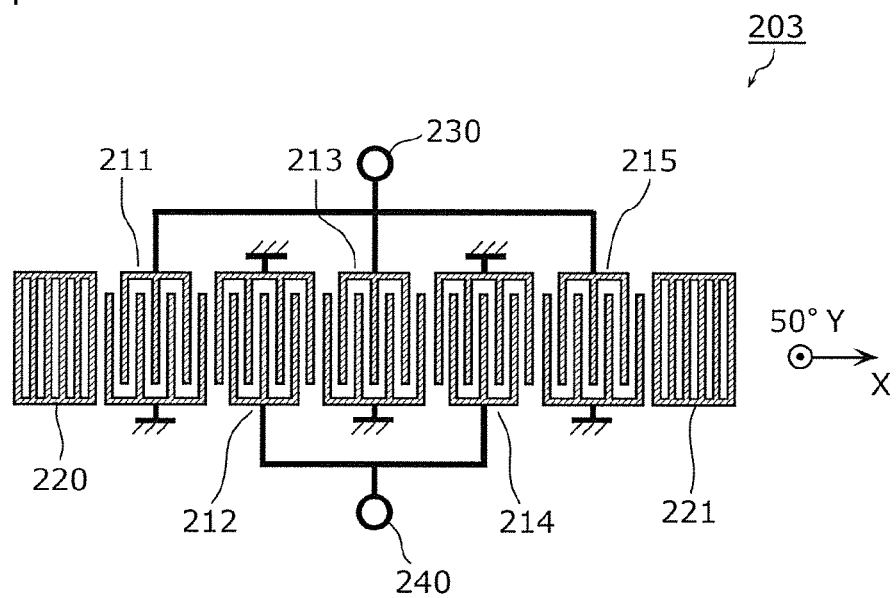
FIG. 4 is a schematic plan view of electrodes of a longitudinally-coupled surface acoustic wave filter according to a preferred embodiment of the present invention.

FIG. 4 is a schematic plan view of electrodes of the longitudinally-coupled filter 203 according to the present preferred embodiment. As illustrated in FIG. 4, the longitudinally-coupled filter 203 includes interdigital transducers 211 to 215, reflectors 220 and 221, an input port 230, and an output port 240.

Each of the interdigital transducers 211 to 215 includes a pair of interdigital transducer electrodes that face each other. The interdigital transducers 212 and 214 interpose the interdigital transducer 213 therebetween in the X-axis direction. The interdigital transducers 211 and 215 interpose the interdigital transducers 212 to 214 therebetween in the X-axis direction. The reflectors 220 and 221 interpose the interdigital transducers 211 to 215 therebetween in the X-axis direction. The interdigital transducers 211, 213, and 215 are connected in parallel between the input port 230 and the reference terminal. The interdigital transducers 212 and 214 are connected in parallel between the output port 240 and the reference terminal.

As illustrated in 3B, the series arm resonator 201 and the parallel arm resonators 251 and 252 define a ladder filter.

A reception input terminal 62 is connected to the common connection terminal 50 (see FIG. 1) with the inductance element 21 (see FIG. 1) interposed therebetween. As illustrated in FIG. 3B, the reception input terminal 62 is connected to the parallel arm resonator 251.

Figure 3D:
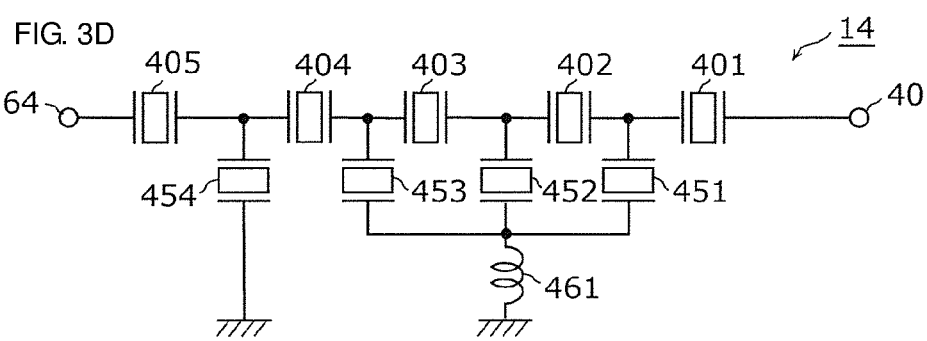
FIG. 3D is a circuit diagram of a reception-side filter of Band66 included in a multiplexer according to a preferred embodiment of the present invention.

FIG. 3D is a circuit diagram of the reception-side filter 14 of Band66 included in the multiplexer 1 according to the present preferred embodiment. As illustrated in FIG. 3D, the reception-side filter 14 includes series arm resonators 401 to 405, parallel arm resonators 451 to 454, and an inductance element 461 that provide matching.

The series arm resonators 401 to 405 are connected in series with each other to a series arm corresponding to a path connecting the reception output terminal 40 and a reception input terminal 64 to each other. The parallel arm resonators 451 to 454 are connected in parallel with each other to respective parallel arms corresponding to paths connecting the reference terminal (ground) and nodes between the reception output terminal 40, the reception input terminal 64, and the series arm resonators 401 to 405 to each other. With this structure of connections between the series arm resonators 401 to 405 and the parallel arm resonators 451 to 454, the reception-side filter 14 defines a ladder band pass filter. The inductance element 461 is connected between nodes of the parallel arm resonators 451, 452, and 453 and the reference terminal.

The reception input terminal 64 is connected to the common connection terminal 50 (see FIG. 1). As illustrated in FIG. 3D, the reception input terminal 64 is connected to the series arm resonator 405, but is not directly connected to the parallel arm resonator 454.

The arrangement of the resonators and the circuit elements of the surface acoustic wave filters included in the multiplexer 1 according to preferred embodiments of the present invention is not limited to the arrangement of the transmission-side filters 11 and 13 and the reception-side filters 12 and 14 described according to the present preferred embodiment. The arrangement of the resonators and the circuit elements of the surface acoustic wave filters is changed in accordance with the specification required for the bandpass characteristic in each frequency band (Band). The term "arrangement" represents, for example, the number of the series arm resonators and the parallel arm resonators and the selection of a filter structure such as the ladder or longitudinally-coupled filter structure.

The arrangement of the transmission-side filters 11 and 13 and the reception-side filters 12 and 14 on a substrate 6 of the multiplexer 1 will now be described.

In the multiplexer 1 according to the present preferred embodiment, as described below, the transmission-side filters 11 and 13 and the reception-side filters 12 and 14 are mounted on the substrate 6. The transmission-side filter 13 is located nearest to the common connection terminal 50.

Figure 5A:
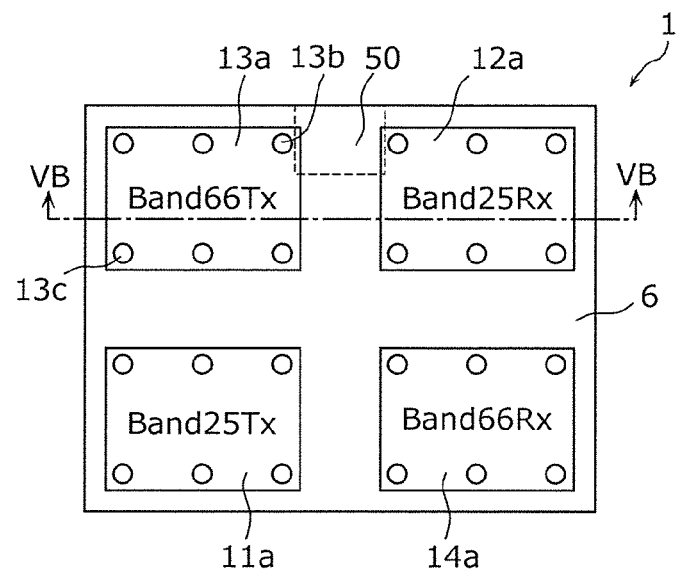
FIG. 5A is a plan view of an example of an arrangement of the transmission-side filters and the reception-side filters of a multiplexer according to a preferred embodiment of the present invention.
Figure 5B:
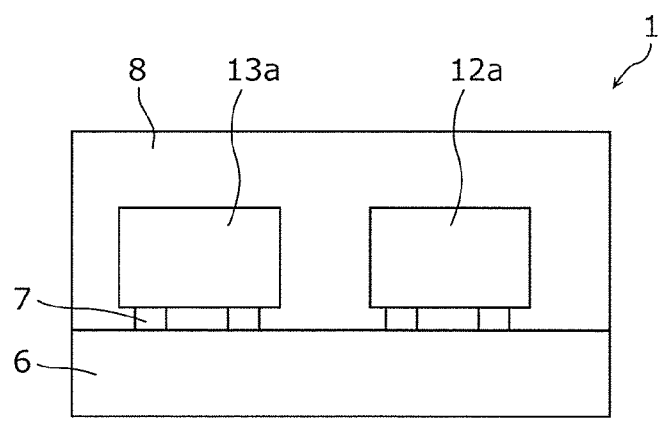
FIG. 5B is a sectional view of an example of an arrangement of the transmission-side filters and the reception-side filters of a multiplexer according to a preferred embodiment of the present invention.

FIG. 5A is a plan view of an example of the arrangement of the transmission-side filters 11 and 13 and the reception-side filters 12 and 14 of the multiplexer 1 according to the present preferred embodiment. FIG. 5B is a sectional view of the example of the arrangement of the transmission-side filters 11 and 13 and the reception-side filters 12 and 14 of the multiplexer 1 according to the present preferred embodiment. The sectional view in FIG. 5B is taken along line VB-VB in FIG. 5A.

Among the transmission-side filters 11 and 13 and the reception-side filters 12 and 14, the transmission-side filter 13 and the reception-side filter 12 are located near an edge of the substrate 6 along which the common connection terminal 50 is provided. The transmission-side filter 11 and the reception-side filter 14 on the substrate 6 are located farther than the transmission-side filter 13 and the reception-side filter 12 from the common connection terminal 50.

As illustrated in FIGS. 5A and 5B, in the multiplexer 1, piezoelectric substrates 11a and 13a included in the transmission-side filters 11 and 13 and piezoelectric substrates 12a and 14a included in the reception-side filters 12 and 14 are mounted on the substrate 6.

The structure of each of the piezoelectric substrates 11a, 12a, 13a, and 14a may preferably be, for example, the same or substantially the same as the piezoelectric substrate 5 illustrated in FIG. 2A at (c) or may be the same or substantially the same as the piezoelectric substrate 57 illustrated in FIG. 2B.

Each of the piezoelectric substrates 11a, 12a, 13a, and 14a includes terminals connected to wiring lines provided on the substrate 6.

Among the piezoelectric substrates 11a, 12a, 13a, and 14a, the piezoelectric substrate 13a located near the edge of the substrate 6 along which the common connection terminal 50 is provided includes a terminal 13b that is located nearest to the common connection terminal 50 and that is connected to the common connection terminal 50 with a wiring line, for example, interposed therebetween. In the transmission-side filter 13, the terminal 13b defines and functions as an antenna terminal. The terminal 13b is located nearest to the common connection terminal 50, for example, in the terminals included in the piezoelectric substrate 13a.

For example, the piezoelectric substrate 13a includes a terminal 13c that is located farthest from the common connection terminal 50 and that is connected to the transmission input terminal 30 with a wiring line, for example, interposed therebetween.

As illustrated in FIG. 5B, the piezoelectric substrates 11a, 12a, 13a, and 14a are mounted on solders 7 on the substrate 6. As illustrated in FIG. 5B, a sealing resin 8 is disposed on the substrate 6 so as to cover the piezoelectric substrates 11a, 12a, 13a, and 14a. The sealing resin 8 is preferably made of, for example, a thermosetting resin or an ultraviolet curable resin.

The substrate 6 includes stacked printed substrates. The stacked printed substrates include wiring patterns and vias.

Figure 6A:
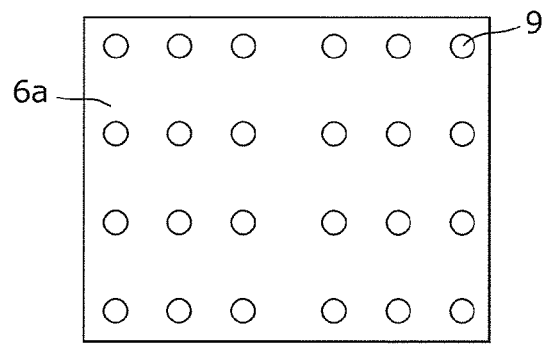
FIG. 6A is a plan view of a first layer of a substrate of a multiplexer according to a preferred embodiment of the present invention.
Figure 6B:
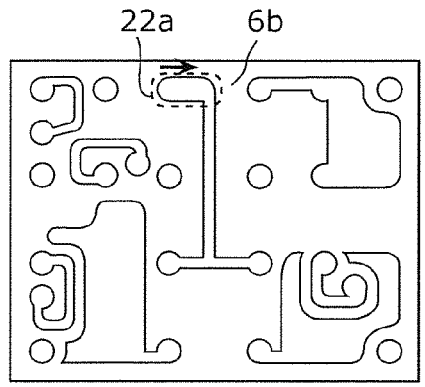
FIG. 6B is a plan view of a second layer of the substrate of the multiplexer according to a preferred embodiment of the present invention.
Figure 6C:
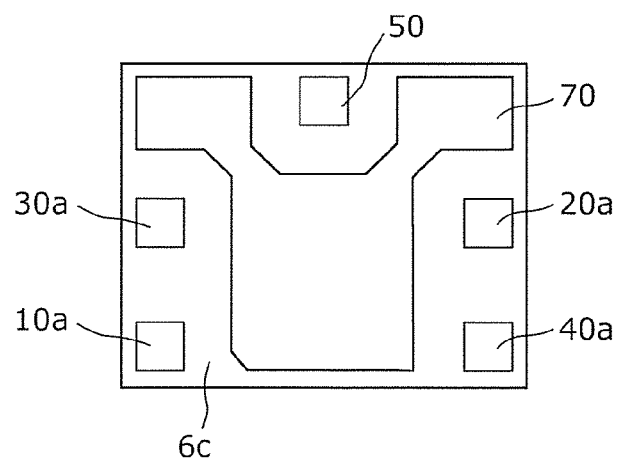
FIG. 6C is a plan view of a third layer of a substrate of a multiplexer according to a preferred embodiment of the present invention.

FIG. 6A is a plan view of a first layer 6a of the substrate 6 of the multiplexer 1 according to the present preferred embodiment. FIG. 6B is a plan view of a second layer 6b of the substrate 6 of the multiplexer 1 according to the present preferred embodiment. FIG. 6C is a plan view of a third layer 6c of the substrate 6 of the multiplexer 1 according to the present preferred embodiment.

As illustrated in, for example, FIGS. 6A to 6C, the substrate 6 includes the first layer 6a, the second layer 6b, and the third layer 6c. The first layer 6a is the uppermost layer of the substrate 6 on which the transmission-side filters 11 and 13 and the reception-side filters 12 and 14 are mounted. The third layer 6c is the lowermost layer of the substrate 6 that is opposite the first layer 6a. The second layer 6b is one of the layers interposed between the first layer 6a and the third layer 6c.

Terminals 9 are provided in or on the first layer 6a. The transmission-side filters 11 and 13 and the reception-side filters 12 and 14 are mounted on the terminals 9. The terminals 9 are connected to at least any one of wiring patterns and terminals provided in or on the layers interposed between the first layer 6a and the third layer 6c or the third layer 6c through the vias (not illustrated).

As illustrated in FIG. 6B, a wiring line 22a is provided in or on the second layer 6b. The wiring line 22a is connected to the terminal 13b in the first layer 6a through the via. Terminals 10a, 20a, 30a, and 40a are provided in or on the third layer 6c, and the transmission input terminal 10, the reception output terminal 20, the transmission input terminal 30, and the reception output terminal 40 are connected to the terminals 10a, 20a, 30a, and 40a. The terminal 30a is connected to the terminal 13c of the piezoelectric substrate 13a with a wiring line that is provided in or on the first layer 6a, the second layer 6b, and the other layers interposed therebetween. The common connection terminal 50 and a ground terminal 70 connected to the ground are provided in or on the third layer 6c. In the third layer 6c, the common connection terminal 50 is adjacent to the edge of the substrate 6. The ground terminal 70 is provided such that the common connection terminal 50, the terminals 10a and 30a, and the terminals 20a and 40a are separated from each other. The inductance elements 21 and 31 may be provided in or on the second layer 6b and the other layers.

The common connection terminal 50 in or on the third layer 6c is connected to the wiring line 22a in or on the second layer 6b through the via. The terminal 13b of the transmission-side filter 13 is connected to the wiring line 22a through the via. The wiring line 22a is provided within the second layer 6b. That is, the wiring line 22a connecting the terminal 13b and the common connection terminal 50 to each other is provided within a single layer. This enables the length of the wiring line connecting the terminal 13b and the common connection terminal 50 to each other to be decreased.

The substrate 6 may include the inductance elements included in the transmission-side filters 11 and 13 and the reception-side filter 14, other wiring lines, and terminals.

Figure 7:
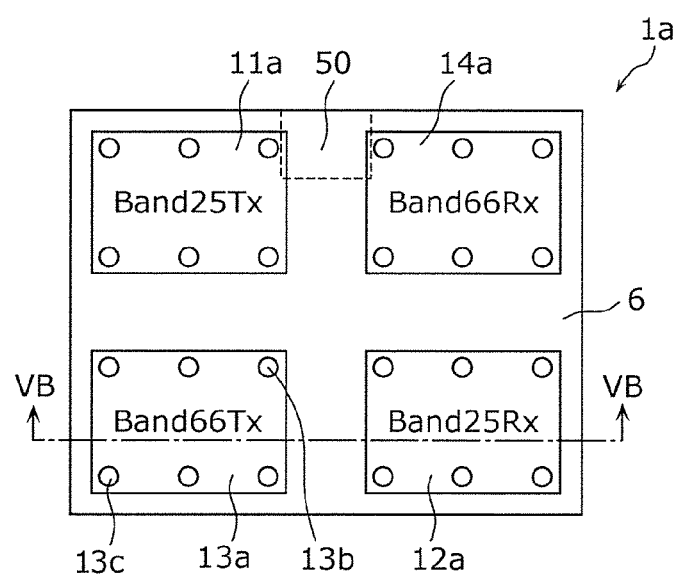
FIG. 7 is a plan view of an example of an arrangement of transmission-side filters and reception-side filters of a multiplexer in a comparative example.
Figure 8A:
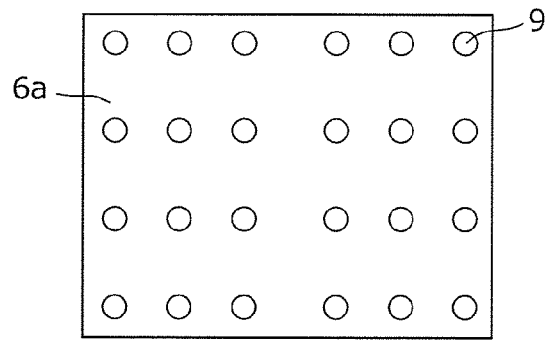
FIG. 8A is a plan view of a first layer of a substrate of the multiplexer in the comparative example.
Figure 8B:
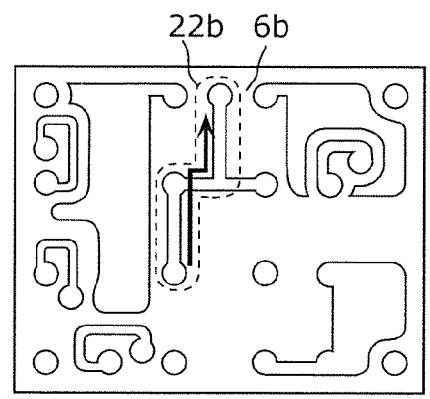
FIG. 8B is a plan view of a second layer of the substrate of the multiplexer in the comparative example.
Figure 8C:
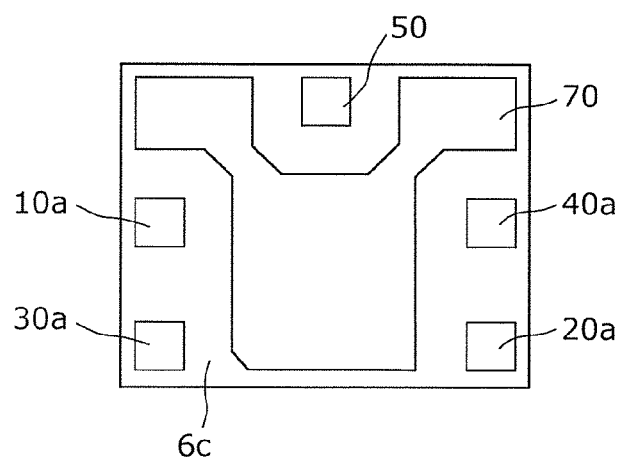
FIG. 8C is a plan view of a third layer of the substrate of the multiplexer in the comparative example.

FIG. 7 is a plan view of an example of an arrangement of the transmission-side filters 11 and 13 and the reception-side filters 12 and 14 of a multiplexer in a comparative example. FIG. 8A is a plan view of the first layer 6a of the substrate 6 of the multiplexer in the comparative example. FIG. 8B is a plan view of the second layer 6b of the substrate 6 of the multiplexer in the comparative example. FIG. 8C is a plan view of the third layer 6c of the substrate 6 of the multiplexer in the comparative example.

As illustrated in FIG. 7, in the multiplexer in the comparative example, the transmission-side filter 11 and the reception-side filter 14 are located near the edge of the substrate 6 along which the common connection terminal 50 is provided. The transmission-side filter 13 and the reception-side filter 12 are located farther than the transmission-side filter 11 and the reception-side filter 14 from the common connection terminal 50.

As illustrated in FIGS. 8A and 8C, the first layer 6a and the third layer 6c of the substrate 6 of the multiplexer in the comparative example are the same or substantially the same as the first layer 6a and the third layer 6c of the multiplexer according to the present preferred embodiment. As illustrated in FIG. 8B, however, the second layer 6b includes a wiring line 22b longer than the wiring line 22a. The wiring line 22b is connected to the terminal 13b of the piezoelectric substrate 13a included in the transmission-side filter 13.

In other words, in the multiplexer 1 according to the present preferred embodiment, the wiring line 22a connected to the terminal 13b is shorter than the wiring line 22b of the multiplexer in the comparative example. Accordingly, an inductance component between the terminal 13b and the common connection terminal 50 is decreased, and the bandpass characteristic of the reception-side filter 14 is prevented from being affected by a spurious wave that the transmission-side filter 13 generates.

Not only the transmission-side filter 13 that generates the spurious wave may be located near the common connection terminal 50, but also the reception-side filter 14, which is affected by the spurious wave that the transmission-side filter 13 generates, may be located near the common connection terminal 50. This prevents the reception-side filter 14 from being affected by the spurious wave that the transmission-side filter 13 generates.

The operating principle of a ladder surface acoustic wave filter according to the present preferred embodiment will now be described.

The parallel arm resonators 151 to 154 illustrated in, for example, FIG. 3A each have a resonant frequency frp and an anti-resonant frequency fap (>frp) as the resonance characteristics. The series arm resonators 101 to 105 each have a resonant frequency frs and an anti-resonant frequency fas (>frs>frp) as the resonance characteristics. The series arm resonators 101 to 105 are designed to have the same or substantially the same resonant frequency frs but do not necessarily have the same resonant frequency frs. The same is true for the anti-resonant frequency fas of the series arm resonators 101 to 105, the resonant frequency frp of the parallel arm resonators 151 to 154, and the anti-resonant frequency fap of the parallel arm resonators 151 to 154, and these resonators do not necessarily have the same resonant frequency and the same anti-resonant frequency.

In the case in which a band pass filter is defined by a ladder resonator, the anti-resonant frequency fap of the parallel arm resonators 151 to 154 is approximately the same the resonant frequency frs of the series arm resonators 101 to 105. Consequently, a lower stopband is approximately the resonant frequency frp at which the impedance of the parallel arm resonators 151 to 154 is about 0. When the frequency increases to more than this, the impedance of the parallel arm resonators 151 to 154 increases at or near the anti-resonant frequency fap, and the impedance of the series arm resonators 101 to 105 is about 0 at or near the resonant frequency frs. Thus, a signal passband on a path from the transmission input terminal 10 to the transmission output terminal 61 is at or near the anti-resonant frequency fap to the resonant frequency frs. When the frequency further increases to approximately the anti-resonant frequency fas, which is a higher stopband, the impedance of the series arm resonators 101 to 105 increases. That is, the anti-resonant frequency fas of the series arm resonators 101 to 105 that is outside the signal passband greatly affects the steepness of the attenuation characteristics in the higher stopband.

When a high-frequency signal is input into the transmission-side filter 11 from the transmission input terminal 10, an electric potential difference is generated between the transmission input terminal 10 and the reference terminal. Consequently, the piezoelectric substrate 5 warps, and a surface acoustic wave is created and propagated in the X-direction. When the repetition pitch X of the interdigital transducer electrodes 101a and 101b matches or substantially matches the wave length of the pass band, a high-frequency signal including a frequency component to be passed alone passes through the transmission-side filter 11.

A ratio of a difference between the resonant frequency and the anti-resonant frequency of each resonator to the resonant frequency is referred to as a resonant fractional bandwidth. For example, the resonant fractional bandwidth of the series arm resonator 101 can be expressed as |fas−frs|/frs.

The high-frequency transmission characteristics of the multiplexer 1 according to the present preferred embodiment will now be described and compared with the high-frequency transmission characteristics of the multiplexer in the comparative example.

The transmission-side filter 13 according to the present preferred embodiment has the same or substantially the same problem as in the transmission-side filter 13 of the multiplexer in the comparative example in that a spurious wave (higher-order mode) is generated at a frequency that is in the pass band of the reception-side filter 14 of Band66. According to the present preferred embodiment, however, the effect of the spurious wave from the transmission-side filter 13 is reduced in a manner in which the transmission-side filter 13 is disposed near the common connection terminal 50 as described below.

Figure 9A:
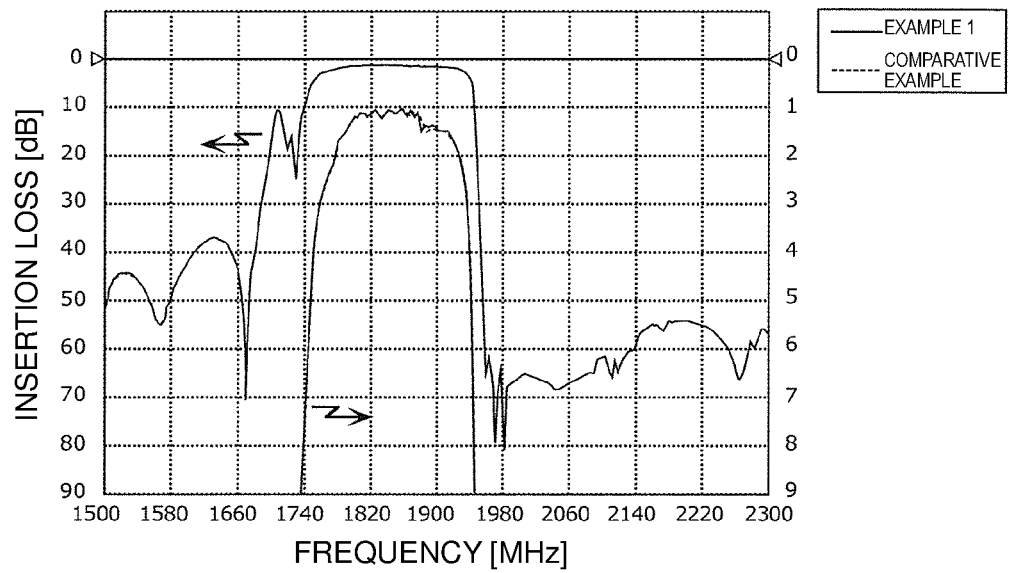
FIG. 9A is a graph in which the bandpass characteristic of the transmission-side filter of Band25 is compared between a preferred embodiment of the present invention and the comparative example.
Figure 9B:
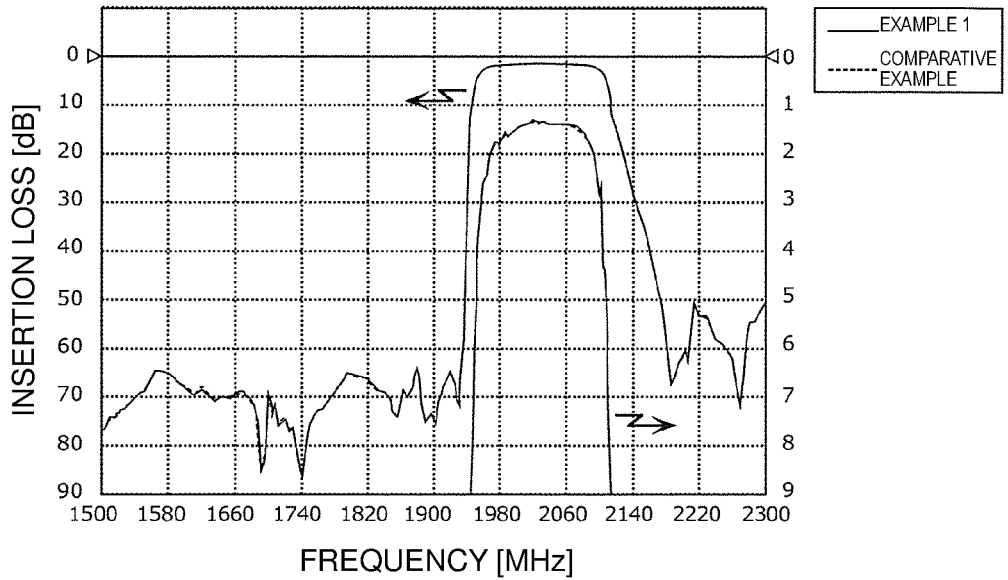
FIG. 9B is a graph in which the bandpass characteristic of the reception-side filter of Band25 is compared between a preferred embodiment of the present invention and the comparative example.
Figure 9C:
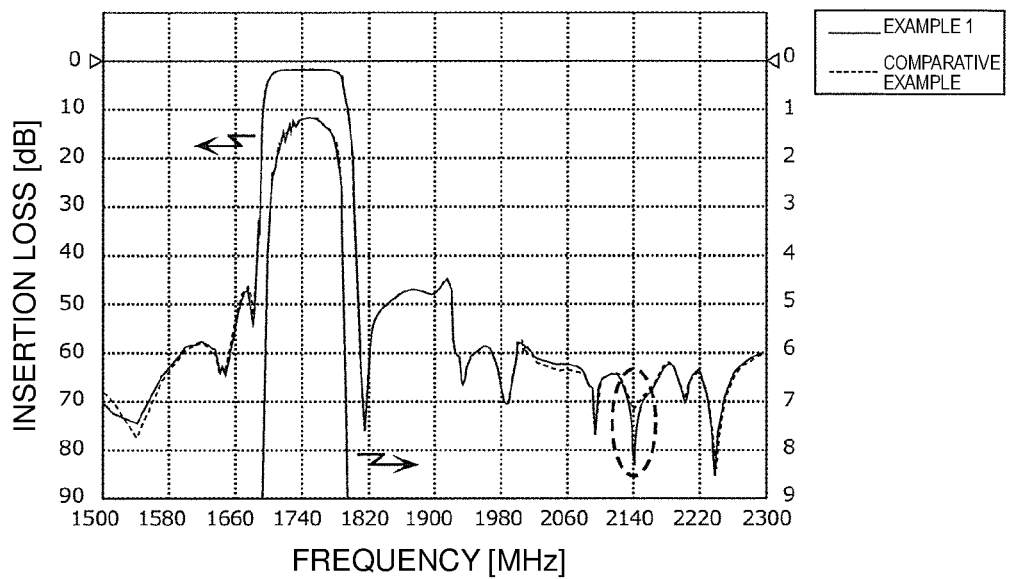
FIG. 9C is a graph in which the bandpass characteristic of the transmission-side filter of Band66 is compared between a preferred embodiment of the present invention and the comparative example.
Figure 9D:
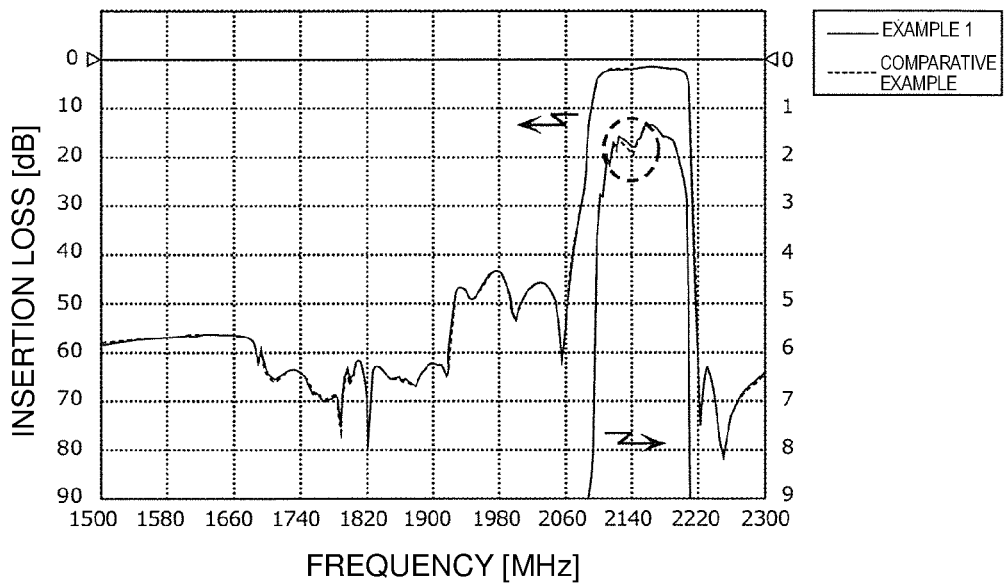
FIG. 9D is a graph in which the bandpass characteristic of the reception-side filter of Band66 is compared between a preferred embodiment of the present invention and the comparative example.

FIG. 9A is a graph in which the bandpass characteristic of the transmission-side filter 11 of Band25 is compared between the present preferred embodiment and the comparative example. FIG. 9B is a graph in which the bandpass characteristic of the reception-side filter 12 of Band25 is compared between the present preferred embodiment and the comparative example. FIG. 9C is a graph in which the bandpass characteristic of the transmission-side filter 13 of Band66 is compared between the present preferred embodiment and the comparative example. FIG. 9D is a graph in which the bandpass characteristic of the reception-side filter 14 of Band66 is compared between the present preferred embodiment and the comparative example. In FIGS. 9A to 9D, the transmission characteristics of each filter when the transmission-side filter according to the present preferred embodiment is used are illustrated as Example 1, and the transmission characteristics of each filter when the transmission-side filter 13 in the comparative example is used are illustrated as the comparative example.

In FIG. 9A, the insertion loss of the transmission-side filter 11 of Band25 in Example 1 is compared with the insertion loss thereof in the comparative example. There is little difference in the magnitude of the insertion loss between Example 1 and the comparative example at about 1850 MHz to about 1915 MHz, which corresponds to the pass band of the transmission-side filter 11.

In FIG. 9B, the insertion loss of the reception-side filter 12 of Band25 in Example 1 is compared with the insertion loss thereof in the comparative example. There is little difference in the magnitude of the insertion loss between Example 1 and the comparative example at about 1930 MHz to about 1995 MHz, which corresponds to the pass band of the reception-side filter 12.

In FIG. 9C, the insertion loss of the transmission-side filter 13 of Band66 in Example 1 is compared with the insertion loss thereof in the comparative example. There is little difference in the magnitude of the insertion loss between Example 1 and the comparative example at about 1710 MHz to about 1780 MHz, which corresponds to the pass band of the transmission-side filter 13. The insertion loss in Example 1 is lower than that in the comparative example at or near about 2000 MHz to about 2100 MHz, which is outside of the pass band of the transmission-side filter 13. As illustrated in a region surrounded by a dashed line in FIG. 9C, the insertion loss (the attenuation) in Example 1 is larger than that in the comparative example at or near about 2130 MHz to about 2150 MHz. That is, according to the present preferred embodiment, the spurious wave generated at or near about 2130 MHz to about 2150 MHz from the transmission-side filter 13 is decreased, and the effect on the other filters is reduced.

In FIG. 9D, the insertion loss of the reception-side filter 14 of Band66 in Example 1 is compared with the insertion loss thereof in the comparative example. As illustrated in a region surrounded by a dashed line in FIG. 9D, the insertion loss in Example 1 is lower than that in the comparative example at or near about 2110 MHz to about 2140 MHz, which is in a pass band of about 2010 MHz to about 2200 MHz of the reception-side filter 14, and the bandpass characteristic is improved.

That is, according to the present preferred embodiment, the attenuation of the transmission-side filter 13 of the multiplexer 1 at or near 2130 to 2150 MHz is improved, and the bandpass characteristic of the reception-side filter 14, which is connected to the transmission-side filter 13 at the common connection terminal 50, at or near about 2110 MHz to about 2140 MHz is improved. The reason will now be described.

The length of the wiring line from the transmission-side filter 13 to the common connection terminal 50 of the multiplexer 1 according to the present preferred embodiment is shorter than the length of the wiring line from the transmission-side filter 13 to the common connection terminal 50 of the multiplexer in the comparative example as described above. Consequently, an inductance component created by the wiring line between the transmission output terminal 63 and the series arm resonator 304 of the transmission-side filter 13 of the multiplexer 1, as Example 1, is lower than that in the multiplexer in the comparative example. For example, the inductance component in the multiplexer 1 according to the present preferred embodiment, as Example 1, is about 0.5 H lower than that in the multiplexer in the comparative example. In this case, it can be considered that the series arm resonator 304 of the transmission-side filter 13 according to the present preferred embodiment that is located nearest to the common connection terminal 50 has an inductance of about −0.5 H.

Figure 10:
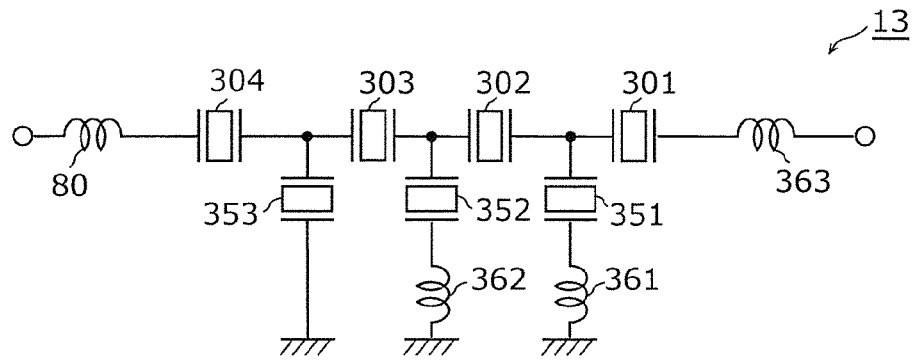
FIG. 10 is a circuit diagram of the transmission-side filter of Band66 for illustrating the effects of a multiplexer according to a preferred embodiment of the present invention.

FIG. 10 is a circuit diagram of the transmission-side filter 13 for illustrating the advantageous effects of the multiplexer 1 according to the present preferred embodiment. In the transmission-side filter 13 according to the present preferred embodiment, as illustrated in FIG. 10, it can be assumed that the series arm resonator 304 located nearest to the common connection terminal 50 in the transmission-side filter 13 is connected to an inductance 80 of about −0.5 H. The series arm resonators 301 to 303, the parallel arm resonators 351 to 353, and the inductance elements 361 to 363 of the transmission-side filter 13 illustrated in FIG. 10 are the same or substantially the same as the series arm resonators 301 to 303, the parallel arm resonators 351 to 353, and the inductance elements 361 to 363 described according to the above preferred embodiment, and a description there of is omitted.

Figure 11A:
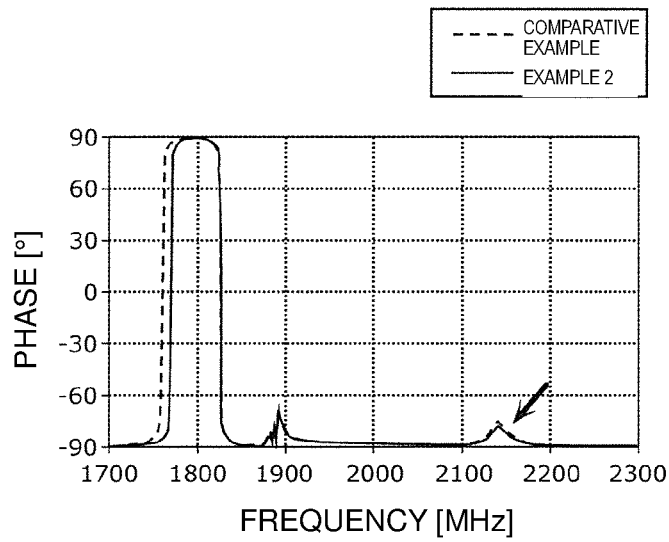
FIG. 11A is a graph in which the phase of a series arm resonator nearest to a common connection terminal in the transmission-side filter of Band66 is compared between a preferred embodiment of the present invention and the comparative example.
Figure 11B:
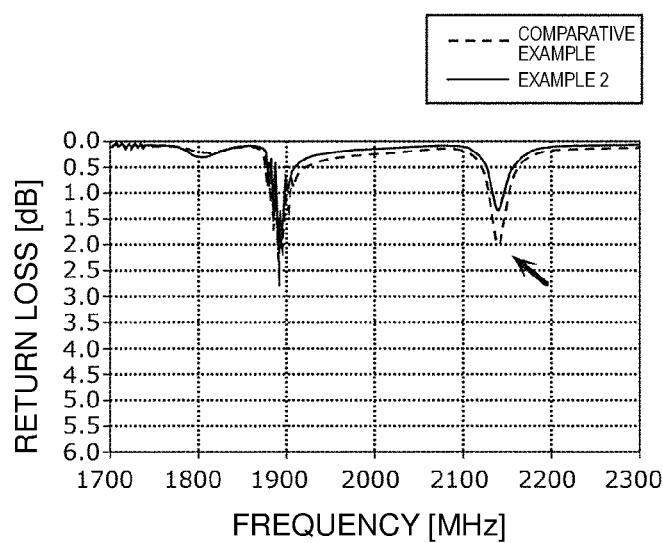
FIG. 11B is a graph in which the return loss of the series arm resonator nearest to the common connection terminal in the transmission-side filter of Band66 is compared between a preferred embodiment of the present invention and the comparative example.

FIG. 11A is a graph in which the phase of the series arm resonator 304 is compared between the present preferred embodiment and the comparative example. FIG. 11B is a graph in which the return loss of the series arm resonator 304 is compared between the present preferred embodiment and the comparative example. In FIG. 11A and FIG. 11B, the result of the series arm resonator 304 of the transmission-side filter 13 according to the present preferred embodiment is illustrated as Example 2, and the result of the series arm resonator 304 in the comparative example is illustrated as the comparative example.

The inductance 80 of about −0.5 H is connected to the series arm resonator 304 according to the present preferred embodiment as described above. The inductance is not connected to the series arm resonator 304 in the comparative example.

As illustrated by an arrow in FIG. 11A, both of the phases in Example 2 and the comparative example have a local maximum point due to the spurious wave (higher-order mode) of the series arm resonator 304 at or near about 2140 MHz that is in the pass band of the reception-side filter 14. The variation in the phase of the series arm resonator 304 in Example 2 is smaller than that of the series arm resonator 304 in the comparative example.

Similarly, as illustrated by an arrow in FIG. 11B, both of the return losses in Example 2 and the comparative example have a local minimum point due to the spurious wave (higher-order mode) of the series arm resonator 304 at or near about 2140 MHz that is in the pass band of the reception-side filter 14. The return loss of the series arm resonator 304 in Example 2 is lower than that of the series arm resonator 304 in the comparative example. The resonant fractional bandwidth of the series arm resonator 304 in the higher-order mode in Example 2 is narrow. The reason for this is that the electromechanical coupling coefficient of the series arm resonator 304 appears to decrease as the inductance connected in series with the series arm resonator 304 in Example 2 is decreased. Thus, the return loss of the series arm resonator 304 in Example 2 decreases. Consequently, the effect of the spurious wave (higher-order mode) of the series arm resonator 304 in the transmission-side filter 13 according to the present preferred embodiment on the reception-side filter 14 is reduced, and the bandpass characteristic of the reception-side filter 14 is prevented from being degraded.

In the series arm resonator 304 in Example 2, as illustrated in FIG. 11A, a ripple of the phase occurs at or near about 1750 MHz, which is approximately in the main mode of the resonant frequency of the series arm resonator 304. Consequently, the resonant fractional bandwidth at the frequency of the main mode of the resonant frequency appears to decrease. In general, as the resonant fractional bandwidth at the frequency of the main mode of the resonant frequency decreases, the pass band width of the transmission-side filter 13 decreases, and the insertion loss of the transmission-side filter 13 in the pass band increases. However, in the transmission-side filter 13 according to the present preferred embodiment, the resonator parameters of not only the series arm resonator 304 but also the series arm resonators 301 to 303 are adjusted, and this prevents the bandpass characteristic of the transmission-side filter 13 from being degraded. Consequently, the multiplexer 1 prevents the bandpass characteristic of the reception-side filter 14 from being degraded without degradation of the bandpass characteristic of the transmission-side filter 13.

The multiplexer 1 according to the present preferred embodiment includes the common connection terminal 50 that is disposed on a first surface of the substrate 6 and that is to be connected to the antenna element 2, and at least three elastic wave filters (the transmission-side filters 11 and 13 and the reception-side filters 12 and 14) that are mounted on a second surface of the substrate 6 opposite the first surface, that are connected to the common connection terminal 50, and that have pass bands different from each other. The first elastic wave filter (the transmission-side filter 13) of the at least three elastic wave filters, which generates a spurious wave at a frequency that is included in a pass band of the second elastic wave filter (the reception-side filter 14) that is at least one of the elastic wave filters that differs from the first elastic wave filter among the at least three elastic wave filters, is located nearest on or in the substrate to the common connection terminal 50 among the at least three elastic wave filters. With this structure, the length of the wiring line connecting the common connection terminal 50 and the transmission-side filter 13 is the shortest among the lengths of the wiring lines connecting the common connection terminal 50 and any one of the transmission-side filters 11 and 13 and the reception-side filters 12 and 14, respectively. Consequently, the inductance component of the wiring line connecting the common connection terminal 50 and the transmission-side filter 13 is made the smallest. Accordingly, the spurious wave generated from the transmission-side filter 13 at a frequency in the pass band of the reception-side filter 14 is decreased. Consequently, the bandpass characteristic of the reception-side filter 14 whose pass band includes a frequency at which a ripple occurs in the transmission-side filter 13 is prevented from being degraded. A loss in the pass band of the transmission-side filter 13 is not increased. Losses in the pass bands of the transmission-side filter 11 and the reception-side filter 12 other than the transmission-side filter 13 and the reception-side filter 14 are not increased. Accordingly, the bandpass characteristic of the multiplexer 1 is prevented from being degraded.

Figure 12:
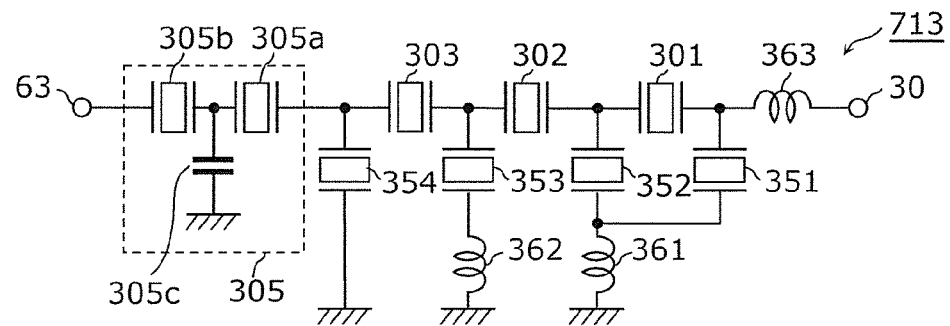
FIG. 12 is a circuit diagram of a transmission-side filter of Band66 included in a multiplexer according to Modification 1 of a preferred embodiment of the present invention.

FIG. 12 is a circuit diagram of a transmission-side filter 713 of Band66 included in a multiplexer according to Modification 1 of a preferred embodiment of the present invention. The multiplexer according to Modification 1 differs from the multiplexer 1 according to the preferred embodiment described above in that the transmission-side filter 713 includes a series arm resonator 305 instead of the series arm resonator 304 located nearest to the common connection terminal 50 in the transmission-side filter 13 according to the above-described preferred embodiment.

FIG. 12 is the circuit diagram of the transmission-side filter 713 of Band66 included in the multiplexer according to Modification 1 of a preferred embodiment of the present invention. As illustrated in FIG. 12, the transmission-side filter 713 includes the series arm resonators 301 to 303, the series arm resonator 305, the parallel arm resonators 351 to 354, and the inductance elements 361 to 363 for matching.

The series arm resonators 301 to 303, the parallel arm resonators 351 to 354, and the inductance elements 361 to 363 are the same or substantially the same as the series arm resonators 301 to 303, the parallel arm resonators 351 to 354, and the inductance elements 361 to 363 described according to the above-described preferred embodiment, and a description thereof is omitted.

The series arm resonator 305 includes resonators 305a and 305b and a capacitance element 305c. The resonators 305a and 305b are surface acoustic wave resonators and have the same or substantially the same structure as the resonator 100. The resonators 305a and 305b have the same or substantially the same resonator parameters as each other. The meaning of "same" described herein includes an error occurred when the resonators 305a and 305b are manufactured.

The resonators 305a and 305b are connected in this order in series to a path connecting the series arm resonator 303 and the transmission output terminal 63 to each other. The capacitance element 305c is connected between a path connecting the resonators 305a and the resonator 305b to each other and the reference terminal. The capacitance element 305c is the first capacitance element.

The capacitance element 305c has an interdigitation capacitance as in, for example, the resonator 100 as described later. The capacitance element 305c is not limited and may not have the interdigitation capacitance. For example, the capacitance element 305c may be defined in a manner in which a wiring line connected to the reference terminal is disposed near a wiring line connecting the resonators 305a and 305b to each other. A mounting substrate (not illustrated) on which the transmission-side filter 713 is mounted may include the capacitance element 305c.

With this structure, an inductance component of the impedance of a wiring line between the series arm resonator 303 and the transmission output terminal 63 is decreased, and a capacitance component thereof is increased. This decreases a spurious wave generated from the transmission-side filter 713 at a frequency that is in the pass band of the reception-side filter 14. Consequently, the bandpass characteristic of the reception-side filter 14 whose pass band includes a frequency at which a ripple occurs in the transmission-side filter 713 is prevented from being degraded. Accordingly, the bandpass characteristic of the multiplexer 1 is prevented from being degraded.

Figure 13:
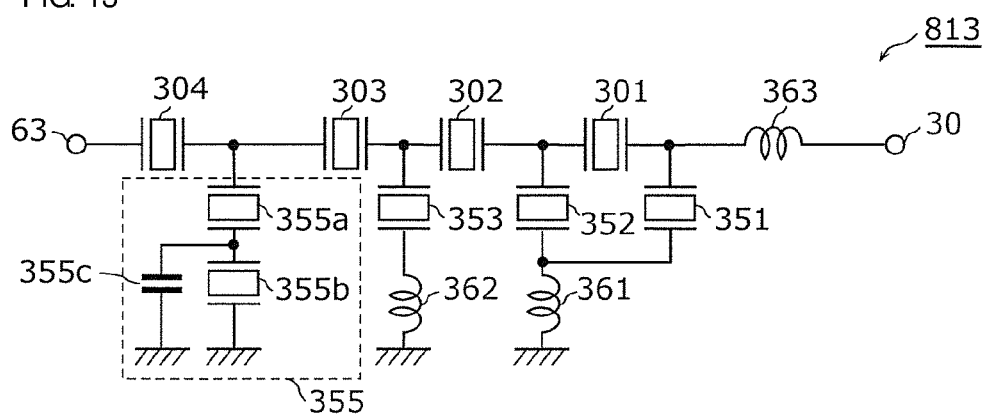
FIG. 13 is a circuit diagram of a transmission-side filter of Band66 included in a multiplexer according to Modification 2 of a preferred embodiment of the present invention.

FIG. 13 is a circuit diagram of a transmission-side filter 813 of Band66 included in a multiplexer according to Modification 2 of a preferred embodiment of the present invention. The multiplexer according to Modification 2 differs from the multiplexer 1 according to the above-described preferred embodiment in that the transmission-side filter 813 includes a parallel arm resonator 355 instead of the parallel arm resonator 354 located nearest to the common connection terminal 50.

As illustrated in FIG. 13, the transmission-side filter 813 includes the series arm resonators 301 to 304, the parallel arm resonators 351 to 353, the parallel arm resonator 355, and the inductance elements 361 to 363 for matching.

The series arm resonators 301 to 304, the parallel arm resonators 351 to 353, and the inductance elements 361 to 363 are the same or substantially the same as the series arm resonators 301 to 304, the parallel arm resonators 351 to 353, and the inductance elements 361 to 363 described according to the above-described preferred embodiment.

The parallel arm resonator 355 includes resonators 355a and 355b and a capacitance element 355c. The resonators 355a and 355b are surface acoustic wave resonators and have the same or substantially the same structure as the resonator 100. The resonators 355a and 355b preferably have the same or substantially the same resonator parameters as each other.

The resonators 355a and 355b are connected in this order in series between a path connecting the series arm resonators 303 and 304 to each other and the ground. The capacitance element 355c is connected between a path connecting the resonator 355a and the resonator 355b to each other and the reference terminal. The capacitance element 355c is the first capacitance element.

The capacitance element 355c has an interdigitation capacitance as in, for example, the resonator 100. The capacitance element 355c is not limited and may not have the interdigitation capacitance. For example, the capacitance element 355c may be defined in a manner in which a wiring line connected to the reference terminal is disposed near a wiring line connecting the resonators 355a and 355b to each other. A mounting substrate (not illustrated) on which the transmission-side filter 813 is mounted may include the capacitance element 355c.

With this structure, an inductance component of the impedance of the wiring line between the series arm resonator 303 and the transmission output terminal 63 is decreased, and a capacitance component thereof is increased as in the case of the transmission-side filter 713 described according to Modification 1. This decreases a spurious wave generated from the transmission-side filter 813 at a frequency that is in the pass band of the reception-side filter 14. Consequently, the bandpass characteristic of the reception-side filter 14 whose pass band includes a frequency at which a ripple occurs in the transmission-side filter 813 is prevented from being degraded. Accordingly, the bandpass characteristic of the multiplexer 1 is prevented from being degraded.

Figure 14:
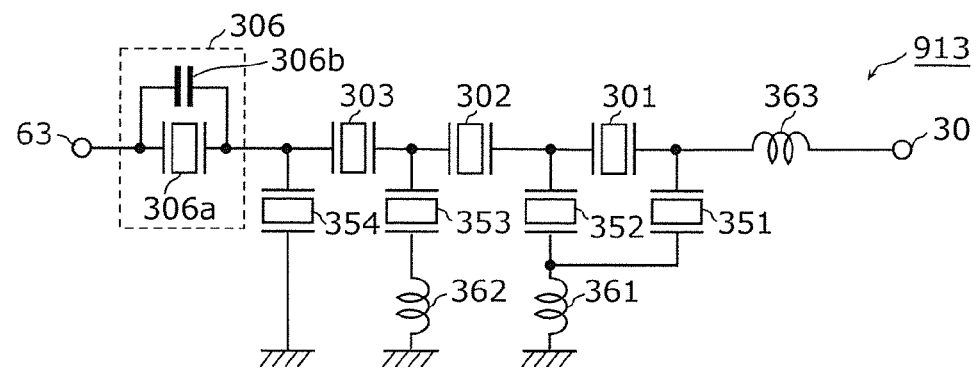
FIG. 14 is a circuit diagram of a transmission-side filter of Band66 included in a multiplexer according to Modification 3 of a preferred embodiment of the present invention.

FIG. 14 is a circuit diagram of a transmission-side filter 913 of Band66 included in a multiplexer according to Modification 3 of a preferred embodiment of the present invention. The multiplexer according to Modification 3 differs from the multiplexer 1 according to the above-described preferred embodiment in that the transmission-side filter 913 of Band66 includes a series arm resonator unit 306 instead of the series arm resonator 304 connected nearest to the common connection terminal 50.

As illustrated in FIG. 14, the transmission-side filter 913 includes the series arm resonators 301 to 303, the series arm resonator 306 unit, the parallel arm resonators 351 to 354, and the inductance elements 361 to 363 that provide matching.

The series arm resonators 301 to 303, the parallel arm resonators 351 to 354, and the inductance elements 361 to 363 are the same or substantially the same as the series arm resonators 301 to 303, the parallel arm resonators 351 to 354, and the inductance elements 361 to 363 described according to the above-described preferred embodiment.

The series arm resonator unit 306 includes a resonator 306a and a capacitance element 306b. The resonator 306a is connected in series with the series arm resonator 303 to a path connecting the series arm resonator 303 and the transmission output terminal 63 to each other. The resonator 306a is a surface acoustic wave resonator and has the same or substantially the same structure as the resonator 100. The capacitance element 306b is connected in series with the series arm resonator 303 and in parallel with the resonator 306a to the path connecting the series arm resonator 303 and the transmission output terminal 63. Specifically, the capacitance element 306b is connected in parallel with the resonator 306a so as to bridge both end portions of the resonator 306a, that is, so as to bridge the input port side and the output port side of the resonator 306a. The capacitance element 306b has the same or substantially the same structure as the capacitance elements 305c and 355c described according to Modifications 1 and 2. The capacitance element 306b is the second capacitance element.

With this simple structure, an inductance component of the impedance of the wiring line between the series arm resonator 303 and the transmission output terminal 63 is decreased, and a capacitance component thereof is increased as in the case of the transmission-side filter 713 described according to Modification 1. This decreases a spurious wave generated from the transmission-side filter 913 at a frequency that is in the pass band of the reception-side filter 14. Consequently, the bandpass characteristic of the reception-side filter 14 whose pass band includes a frequency at which a ripple occurs in the transmission-side filter 913 is prevented from being degraded. Accordingly, the bandpass characteristic of the multiplexer 1 is prevented from being degraded.

In the transmission-side filter 913 illustrated in FIG. 14, the series arm resonator unit 306 located nearest to the common connection terminal 50 includes the resonator 306a and the capacitance element 306b. The present invention, however, is not limited thereto. The parallel arm resonator 354 located nearest to the common connection terminal 50 may be replaced by a parallel arm resonator 354 including a resonator and a capacitance element connected to the resonator in parallel. More specifically, in the parallel arm resonator 354, the resonator may be connected between a path connecting the series arm resonator unit 306 and the series arm resonator 303 to each other and the ground, and the capacitance element may be connected to both sides of the resonator in parallel with the resonator. In this case, the transmission-side filter 913 may include the series arm resonator 304 instead of the series arm resonator unit 306 or may include neither the series arm resonator unit 306 nor the series arm resonator 304.

A preferred embodiment of a quadplexer is described above by way of example to describe the multiplexers according to preferred embodiments of the present invention. The present invention, however, is not limited thereto. For example, the present invention includes the following modifications of the above-described preferred embodiment.

The capacitance element may be connected between the path connecting the two resonators to each other and the reference terminal as in Modification 1 or may be connected to both sides of the resonator in parallel with the resonator as in Modification 3.

The resonator parameters of the resonators may be appropriately changed.

Each of the capacitance elements described according to Modifications 1 and 2 may be an interdigitation capacitance or another element. For example, each capacitance element may be defined in a manner in which the wiring line connected to the reference terminal is disposed near the wiring line connecting the two resonators. A mounting substrate on which the transmission-side filter is mounted may include the capacitance element.

The multilayer structure, the material, the cut-angles, and the thickness of the piezoelectric film 53 and the piezoelectric substrate 57 included in each resonator may be appropriately changed in accordance with the required bandpass characteristic of the elastic wave filter device.

A multiplexer according to a preferred embodiment of the present invention may include the inductance element 31 connected between the path connecting the antenna element and the common connection terminal to each other and the ground as described above or the inductance element 31 connected in series to the path connecting the antenna element and the common connection terminal to each other. For example, the multiplexers according to preferred embodiments of the present invention may include a high-frequency substrate on which elastic wave filters having the above-described features and the chip inductance elements 21 and 31. The inductance elements 21 and 31 may be, for example, chip inductors or may be defined by a conductive pattern on a high-frequency substrate. A multiplexer according to a preferred embodiment of the present invention may not include the inductance element 31.

A multiplexer according to a preferred embodiment of the present invention is not limited to the quadplexer of Band25 and Band66.

For example, a multiplexer according to a preferred embodiment of the present invention may be a hexaplexer including six frequency bands that is used in a system including a combination of Band25, Band66, and Band30 including a transmission band and a reception band. In this case, for example, the inductance element 21 is connected to the reception-side filter of Band25 in series, and the parallel arm resonator is connected to the reception input terminal of the reception-side filter of Band25. In addition, the series arm resonator is connected to the terminals of five filters other than the reception-side filter of Band25 that are connected to the common connection terminal, and the parallel arm resonator is not connected thereto.

A multiplexer according to a preferred embodiment of the present invention may be a hexaplexer including six frequency bands that is used in a system including a combination of Band1, Band3, and Band1 including a transmission band and a reception band. In this case, for example, the inductance element 21 is connected to the reception-side filter of Band1 in series, and the parallel arm resonator is connected to the reception input terminal of the reception-side filter of Band1. In addition, the series arm resonator is connected to the terminals of five filters other than the reception-side filter of Band1 that are connected to the common connection terminal, and the parallel arm resonator is not connected thereto.

Multiplexers according to preferred embodiments of the present invention are able to decrease the insertion loss in the pass band more than a multiplexer that uses a matching method of the related art, and the insertion loss is more effectively decreased as the number of the elastic wave filters thereof increases.

A multiplexer according to a preferred embodiment of the present invention may not include the duplexers that transmits and receives the signals. The multiplexer may be used, for example, as a transmitting device including transmission frequency bands, or a receiving device including reception frequency bands. The transmitting device and the receiving device with the above structure achieve the same or substantially the same advantageous effects as in the multiplexer 1 according to the above-described preferred embodiment.

In an example described according to one of the above-described preferred embodiments, the surface acoustic wave filters including the interdigital transducer electrodes are described as the transmission-side filters and the reception-side filters included in the multiplexer, the quadplexer, the transmitting device, and the receiving device. However, the filters included in the multiplexer, the quadplexer, the transmitting device, and the receiving device according to the preferred embodiments and the modifications of the present invention may be elastic wave filters that use boundary acoustic waves or BAW (Bulk Acoustic Wave) defining the series arm resonators and the parallel arm resonators. This achieves the same or substantially the same advantageous effects as in the multiplexer, the quadplexer, the transmitting device, and the receiving device, according to the above-described preferred embodiments.

In the multiplexer 1 according to the above-described preferred embodiment, the inductance element 21 is connected to the reception-side filter 12 in series. However, the inductance element 21 may be connected to the transmission-side filters 11 and 13 or the reception-side filter 14 in series. According to preferred embodiments of the present invention, the inductance element 21 may not be provided. This also enables a multiplexer having a low loss to be provided even when the number of the bands and the modes that are required is increased.

Preferred embodiments of the present invention may be widely used, for example, as multiplexers, transmitting devices, and receiving devices that have a low loss and that support a multi-band and multi-mode frequency standard in communication equipment, such as a cellular phone.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer that transmits and receives high-frequency signals via an antenna element, the multiplexer comprising:
   a substrate including a first surface and a second surface opposite the first surface;
   a common connection terminal that is disposed on the first surface of the substrate and that is to be connected to the antenna element; and
   at least three elastic wave filters that are mounted on the second surface of the substrate, that are connected to the common connection terminal, and that have pass bands different from each other; wherein
   a first elastic wave filter of the at least three elastic wave filters, which generates a spurious wave at a frequency that is included in a pass band of a second elastic wave filter that is at least one of the elastic wave filters that differs from the first elastic wave filter among the at least three elastic wave filters, is located nearest on the substrate to the common connection terminal among the at least three elastic wave filters.

2. The multiplexer according to claim 1, wherein the second elastic wave filter is located nearer on the substrate to the common connection terminal than at least one elastic wave other than the first elastic wave filter and the second elastic wave filter among the at least three elastic wave filters.

3. The multiplexer according to claim 1, wherein
   the substrate includes a plurality of layers; and
   a wiring line connecting the first elastic wave filter and the common connection terminal to each other is provided in or on one of the plurality of layers.

4. The multiplexer according to claim 1, wherein
   the first elastic wave filter includes an input terminal, an output terminal, and at least one of a parallel arm resonator unit and a series arm resonator unit, the series arm resonator unit being disposed on a path connecting the input terminal and the output terminal to each other, the parallel arm resonator unit being connected between the path and a reference terminal; and
   at least one of the series arm resonator unit nearest to the common connection terminal and the parallel arm resonator unit nearest to the common connection terminal includes:
      elastic wave resonators that are connected in series; and
      a first capacitance element that is connected between at least one of paths connecting the elastic wave resonators to each other and the reference terminal.

5. The multiplexer according to claim 1, wherein
   the first elastic wave filter includes an input terminal, an output terminal, and at least one of a parallel arm resonator unit and a series arm resonator unit, the series arm resonator unit being disposed on a path connecting the input terminal and the output terminal to each other, the parallel arm resonator unit being connected between the path and a reference terminal; and
   at least one of the series arm resonator unit nearest to the common connection terminal and the parallel arm resonator unit nearest to the common connection terminal includes:
      at least one elastic wave resonator; and
      a second capacitance element that is connected to the at least one elastic wave resonator in parallel so as to bridge both end portions of the at least one elastic wave resonator.

6. The multiplexer according to claim 1, wherein
   the first elastic wave filter includes a piezoelectric substrate; and
   the piezoelectric substrate includes:
      a piezoelectric film including a surface on which an interdigital transducer electrode is provided;
      a high acoustic velocity support substrate through which a bulk wave is propagated at an acoustic velocity higher than an acoustic velocity at which an elastic wave is propagated through the piezoelectric film; and
      a low acoustic velocity film that is disposed between the high acoustic velocity support substrate and the piezoelectric film and through which a bulk wave is propagated at an acoustic velocity lower than an acoustic velocity at which a bulk wave is propagated through the piezoelectric film.

7. The multiplexer according to claim 6, wherein the first elastic wave filter further includes a protective layer covering the interdigital transducer electrode.

8. The multiplexer according to claim 7, wherein the protective layer is defined by a film including silicon dioxide as a main component.

9. The multiplexer according to claim 7, wherein the protective layer has a thickness of about 25 nm.

10. The multiplexer according to claim 6, wherein the interdigital transducer electrode has a multilayer structure including a close-contact layer and a main electrode layer provided on the close-contact layer.

11. The multiplexer according to claim 10, wherein the main electrode layer has a thickness of about 162 nm.

12. The multiplexer according to claim 10, wherein the close-contact layer is made of Ti.

13. The multiplexer according to claim 10, wherein the close-contact layer has a thickness of about 12 nm.

14. The multiplexer according to claim 10, wherein the main electrode layer is made of Al including about 1% of Cu.

15. The multiplexer according to claim 1, wherein
the first elastic wave filter includes a piezoelectric substrate; and
the piezoelectric substrate is made of a LiNbO$_3$ piezoelectric single crystal substrate including a surface on which an interdigital transducer electrode is provided.

16. The multiplexer according to claim 1, wherein
the multiplexer is a quadplexer including a Band25 duplexer and a Band66 duplexer;
the at least three elastic wave filters include a transmission-side filter and a reception-side filter of the Band25 duplexer, and a transmission-side filter and a reception side filter of the Band66 duplexer; and
the first elastic wave filter defines the reception-side filter of the Band25 duplexer.

17. The multiplexer according to claim 16, further comprising an inductance element connected between the reception-side filter of the Band25 duplexer and the common connection terminal.

18. The multiplexer according to claim 16, wherein the transmission-side filter of the Band66 duplexer is an unbalanced-input-unbalanced-output band pass filter.

* * * * *